(12) United States Patent
Kase et al.

(10) Patent No.: US 7,667,492 B2
(45) Date of Patent: Feb. 23, 2010

(54) INPUT BUFFER

(75) Inventors: Kiyoshi Kase, Austin, TX (US); May Len, Lawrenceville, GA (US); Dzung T. Tran, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/004,617

(22) Filed: Dec. 21, 2007

(65) Prior Publication Data
US 2009/0160484 A1 Jun. 25, 2009

(51) Int. Cl.
*H03K 19/094* (2006.01)
(52) U.S. Cl. .......................................... 326/83; 326/87
(58) Field of Classification Search ................... 326/83, 326/86, 87, 31, 26; 327/205–206, 108–109
See application file for complete search history.

(56) References Cited

U.S. PATENT DOCUMENTS

| | | | |
|---|---|---|---|
| 6,084,456 A * | 7/2000 | Seol | 327/206 |
| 6,870,402 B2 * | 3/2005 | Sylvester et al. | 327/24 |
| 7,005,910 B2 | 2/2006 | Becker et al. | |
| 7,190,206 B2 * | 3/2007 | Lee et al. | 327/333 |
| 7,256,617 B2 * | 8/2007 | Ananthanarayanan et al. | 326/87 |
| 7,276,935 B1 | 10/2007 | Camarota | |

* cited by examiner

Primary Examiner—James Cho
(74) Attorney, Agent, or Firm—Charles W. Bethards

(57) ABSTRACT

Methods and corresponding systems for buffering an input signal include outputting a first logic value in response to the input signal being below a lower threshold. A second logic value is output in response to the input signal rising above the lower threshold. Thereafter, the second logic value is maintained until the input exceeds a higher threshold and thereafter falls below the higher threshold. In response to the input signal falling below the higher threshold, the first logic value is output, and maintained at the first logic value, until the input falls below the lower threshold and thereafter rises above the lower threshold.

13 Claims, 3 Drawing Sheets ents will be briefly discussed and described. As shown, buffer circuit 100 can include threshold detector 180, which

INPUT BUFFER

BACKGROUND

1. Field

This disclosure relates generally to input buffer circuits, and more specifically input buffer circuits for receiving digital data transmissions.

2. Related Art

In high speed data communication systems, data interconnect systems behave like transmission lines when transmitting data, in the form of electric signals, from one point to another. As the electric signals are transmitted, they can be modified by the electrical properties (e.g., the transfer characteristics) of the transmission line or transmission line system. When electric signals are received, an input buffer circuit (i.e., a buffer circuit operating as an input to another circuit) can be used to interpret the digital data by determining whether a high level signal or a low level signal has been received, which signal levels can represent digital data interpreted as ones or zeros, or high logic values or low logic values.

The operation of the buffer circuit can improve the rejection of noise in the digital signal. For example, hysteresis can be used to clean up the waveform. However, conventional hysteresis input buffers can introduce undesirably long propagation delays when receiving a stair-stepped waveform. The stair-stepped waveform can be produced in an asymmetric transmission line system, or multiple-point transmission line network, due to forwarding and reflections. The forwarding and reflections can be caused by a transmitted signal being distributed to two different receivers that are different distances from the signal transmitter. In one case, a reflected signal generated at a more distant receiver can influence a rising or falling signal at the input of a closer receiver (i.e., less distant from the signal transmitter), thereby causing a stair stepped waveform at the input of the closer receiver. The stair step in the waveform introduces an undesirable delay as the signal transitions from low to high, or high to low, logic values. Note that the delay caused by the stair-stepped waveform can also be a problem for the widely used input buffers that do not use hysteresis, wherein a switch point threshold is set near 50% of the input level range.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
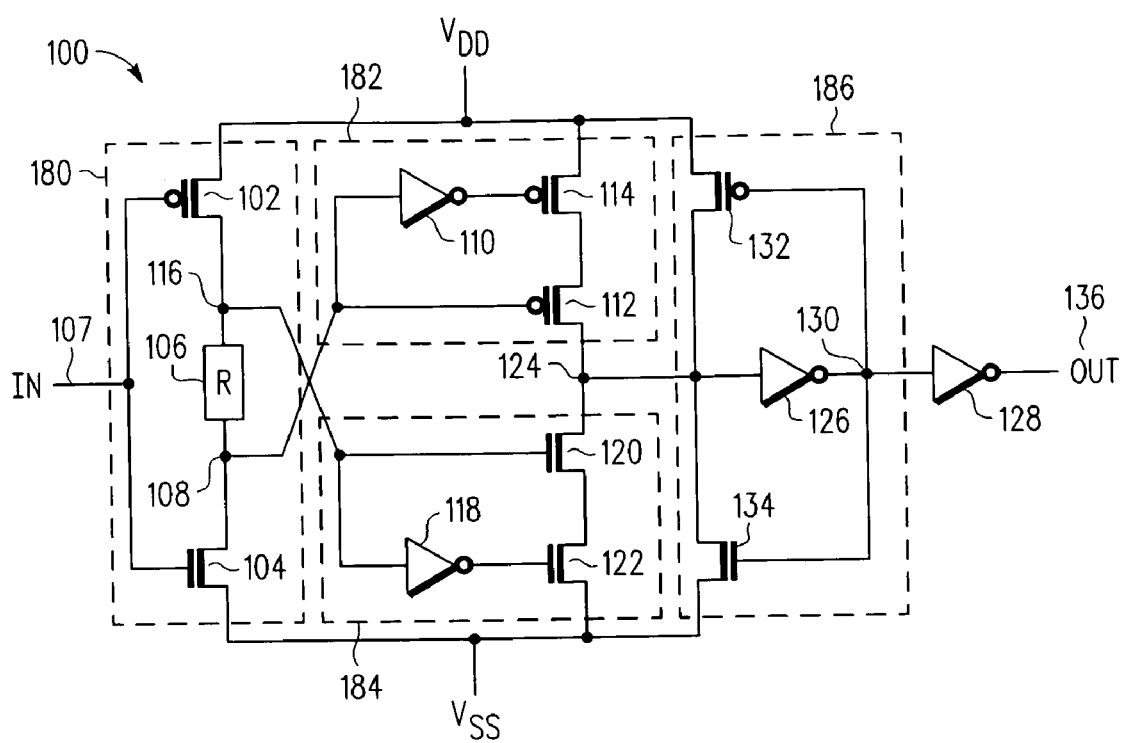
FIG. 1 is a high-level schematic diagram of a buffer circuit in accordance with one or more embodiments.

Referring to FIG. 1, a high-level schematic diagram of a buffer circuit 100 in accordance with one or more embodiments will be briefly discussed and described. As shown, buffer circuit 100 can include threshold detector 180, which can have one or more outputs connected to first pulse generator 182 and second pulse generator 184. First and second pulse generators 182 and 184 can have outputs coupled to an input of latch 186. Latch 186 can have an output coupled to inverter 128 to produce a non-inverted, buffered output signal at output 136.

Threshold detector 180 can receive input signal 107, and output a threshold crossing signal (or, in some embodiments, two threshold crossing signals), wherein the threshold crossing signal is responsive to the input signal rising above a lower threshold, and responsive to the input signal falling below a higher threshold, wherein the lower threshold is less than the higher threshold. In the embodiment shown in FIG. 1, threshold detector 180 outputs a lower threshold crossing signal from node 108 (e.g., a signal corresponding to waveform 238 in FIG. 2, which can also be referred to as signal 238), and a higher threshold crossing signal from node 116 (e.g., a signal corresponding to waveform 240 in FIG. 2, which can also be referred to as signal 240). In the embodiment represented by FIGS. 1 and 2, threshold detector 180 produces a signal (e.g., lower threshold crossing signal) having a logic value transition (e.g., a transition falling from a higher level to a lower level as shown at time 212) in response to the input signal rising above a lower threshold (e.g. lower threshold 208), and threshold detector 180 produces a signal (e.g., higher threshold crossing signal) having a logic value transition (e.g. a transition rising from a lower level to a higher level as shown at time 228) in response to the input signal falling below a higher threshold (e.g., higher threshold 218).

Threshold detector 180 can include first transistor 102 and second transistor 104, which are connected in series with resistive element 106. First transistor 102, which, in the embodiment shown, is a P-channel transistor (e.g., a transistor having a first or one conductivity type), can have a first or one current electrode (e.g., a source electrode), and a second or another current electrode (e.g., a drain electrode), and a control electrode (e.g., a gate electrode). The source electrode of first transistor 102 can be coupled to voltage source $V_{DD}$, the drain electrode can be coupled to a first terminal of resistive element 106, and the gate electrode can be coupled to input signal 107, which is labeled "IN".

Second transistor 104, in the embodiment shown in FIG. 1, can have a drain electrode coupled to a second terminal of resistive element 106, a source electrode coupled to voltage source $V_{SS}$, and a gate electrode coupled to input signal 107. In one embodiment, voltage source $V_{DD}$ can be set to 1.8 volts, and voltage source $V_{SS}$ can be set to 0 volts. Input signal 107 can be a digital signal having high and low logic levels or values, which can be represented by high and low voltages or high and low currents, depending upon a mode of operation. High and low voltages can range substantially between $V_{DD}$ and $V_{SS}$.

Resistive element 106 can be implemented, in one embodiment, with a resistive material, such as a poly resistor, or the like. In another embodiment, resistive element 106 can be implemented using active components, such as one or more transistors that are appropriately biased to provide a fixed resistance between the first and second terminals of resistive element 106. In yet another embodiment, resistive element 106 can include a bypass switch to change the resistance value, which can change the lower and higher threshold values 208 and 218 (see FIG. 2), respectively.

Node 108 can be formed at the connection between the drain terminal of second transistor 104 and the second terminal of resistive element 106. A signal waveform that can be produced at node 108 is shown as signal 238 in FIG. 2, which signal can also be referred to as a lower threshold crossing signal, or as an output signal of threshold detector 180.

Node 108 can also be connected to an input of first pulse generator 182. First pulse generator 182 can output a first pulse having a first logic value in response to the threshold crossing signal. In the embodiment shown in FIG. 1, the first logic value can be a high logic level substantially equal to voltage source $V_{DD}$ (i.e., within 10% of $V_{DD}$). In one embodiment, the threshold crossing signal can be a transition from a high logic value to a low logic value, as shown at time 212 in signal 238 in FIG. 2.

First pulse generator 182 can include first inverter 110, third transistor 112, and fourth transistor 114. A gate electrode of third transistor 112, which, in the embodiment shown, is a P-channel transistor, can be connected to node 108. An output terminal of first inverter 110 can be coupled to a gate terminal of fourth transistor 114, which, in the embodiment shown, is a P-channel transistor. A source terminal of fourth transistor 114 can be connected to voltage source $V_{DD}$, and a drain terminal of fourth transistor 114 can be connected to a source terminal of third transistor 112. When first pulse generator 182 receives the threshold crossing signal that transitions from a high logic value to a low logic value, first pulse generator 182 initially turns on third transistor 112 while fourth transistor 114 remains on. As soon as a low level signal propagates through first inverter 110, the control terminal of fourth transistor 114 goes high, which turns fourth transistor 114 off. Thus, first pulse generator 182 responds to a falling logic value transition by creating a high-level pulse that lasts for the duration of the signal propagation time through first inverter 110. No pulse is created in response to a rising logic value transition because third transistor 112 turns off before fourth transistor 114 turns on in a sequence analogous to a break before make switch.

Node 116 can be formed at the connection between the drain terminal of first transistor 102 and the first terminal of resistive element 106. A signal waveform that can be produced at node 116 is shown as signal 240 in FIG. 2, which signal can also be referred to as a higher threshold crossing signal, or as an output signal of threshold detector 180.

Node 116 can also be connected to an input of second pulse generator 184. Second pulse generator 184 can output a second pulse having a second logic value in response to the threshold crossing signal. In the embodiment shown in FIG. 1, the second logic value can be a low logic level substantially equal to voltage source $V_{SS}$ (i.e., within 10% of $V_{SS}$).

Second pulse generator 184 can include second inverter 118, fifth transistor 120, and sixth transistor 122. A gate electrode of fifth transistor 120, which, in the embodiment shown, is a N-channel transistor, can be connected to node 116. An output terminal of second inverter 118 can be coupled to a gate terminal of sixth transistor 122, which, in the embodiment shown, is a N-channel transistor. A source terminal of sixth transistor 122 can be connected to voltage source $V_{SS}$, and a source terminal of fifth transistor 120 can be connected to a drain terminal of sixth transistor 122. Node 124 can be formed at the connection between the drain terminal of third transistor 112 and the drain terminal of fifth transistor 120. When second pulse generator 184 receives the threshold crossing signal that transitions from a low logic value to a high logic value, second pulse generator 184 creates a low-level pulse that lasts for the duration of the signal propagation time through second inverter 118. During the low to high transition, sixth transistor 122 is already on while fifth transistor 120 begins to turn on. Fifth transistor 120 and sixth transistor 122 both remain on while the threshold crossing signal propagates through second inverter 118, thereby creating the low-level pulse. Second pulse generator 184 creates a low-level pulse in response to a rising signal transition, but does not create a pulse in response to a falling signal transition because fifth transistor 120 will turn off before the threshold crossing signal propagates through second inverter 118 to turn on sixth transistor 122.

Note that in one embodiment, first pulse generator 182 and second pulse generator 184 can be connected to the same threshold crossing signal if that threshold crossing signal has a falling level transition as input signal 202 crosses above lower threshold 208, and has a rising level transition as input signal 202 falls below higher threshold 218. In the embodiment depicted in FIGS. 1 and 2, two threshold crossing signals are used: (1) a lower threshold crossing signal having a falling level transition in response to an input signal 202 rising above lower threshold 208, and (2) a higher threshold crossing signal having a rising level transition in response to input signal 202 falling below higher threshold 218.

Node 124 can also be connected to an input terminal of latch 186. Latch 186 can include third inverter 126, seventh transistor 132, and eighth transistor 134. Thus, latch 186 is connected to the first pulse generator output, and to the second pulse generator output. Latch 186 outputs a buffered signal responsive to the first pulse and the second pulse, which are output by first pulse generator 182 and second pulse generator 184, respectively. In response to the first pulse, latch 186 can output and maintain a second logic value. In response to the second pulse, latch 186 can output and maintain a first logic value.

An output terminal of third inverter 126 can be connected to an input terminal of fourth inverter 128. Fourth inverter 128 can produce a non-inverted buffered signal. Node 130 can be formed at the connection between the output terminal of third inverter 126 and the input terminal of fourth inverter 128.

In the embodiment shown, node 130 can be connected to a gate terminal of seventh transistor 132 (a P-channel transistor) and a gate terminal of eighth transistor 134 (an N-channel transistor). A source terminal of seventh transistor 132 can be connected to voltage source $V_{DD}$, and a drain terminal of seventh transistor 132 can be connected to node 124. A drain terminal of eighth transistor 134 can be connected to node 124, and a source terminal of eighth transistor 134 can be connected to voltage source $V_{SS}$.

Figure 2:
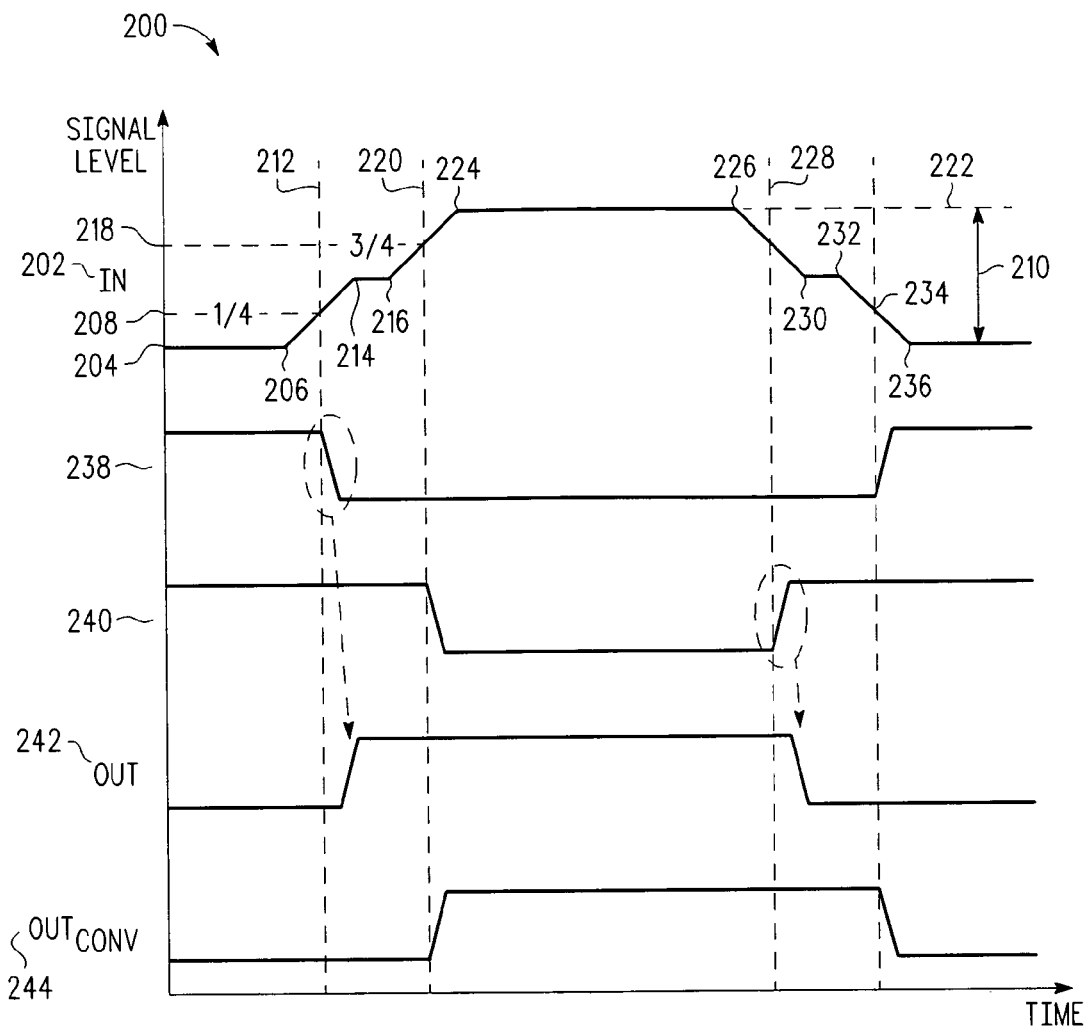
FIG. 2 is a diagram representing signal levels in parts of the buffer circuit of FIG. 1 in accordance with one or more embodiments, and an output signal level of a known buffer circuit.

In FIG. 2, there is depicted a diagram 200 that represents signal levels in parts of the buffer circuit 100 shown in of FIG. 1 in accordance with one or more embodiments, and an output signal of a known buffer circuit. The vertical axis of diagram 200 can represent signal level or amplitude, while the horizontal axis can represent time. As illustrated, input signal 202 begins at a low level 204, and then begins to rise at time 206. Lower threshold 208 can be set, as shown in this example, at a level 25% of the full range 210 of input signal values.

At time 212, input signal 202 rises above lower threshold 208 and continues to rise until time 214, wherein a reflection in an asymmetric transmission line system causes a stair step feature (e.g., a portion of the signal transition between logic values having a reduced transition rate) in the waveform between times 214 and 216. In the embodiment shown in FIG. 2, a stair step feature is shown as a substantially flat portion of input signal 202 between times 214 and 216, and between times 230 and 232 (e.g., portions wherein the rate of signal rise or the rate of signal fall is close to zero). In other embodiments, the stair step feature can include various waveforms and rates of transition that may be confined to a stair step range, which can include signal levels above and/or below the portion of input signal between times 214 and 216, and between times 230 and 232, thus defining a range about the level at time 214 (or time 230), wherein the range has lower and upper limits. This stair step feature delays the rise of input signal 202 by a time substantially equal to the time between 214 and 216. At time 216, input signal 202 continues to rise, and rises above higher threshold 218 at time 220, and finally reaches high level 222 at time 224.

At time 226, input signal 202 begins to fall, and falls below higher threshold 218 at time 228. Between times 230 and 232, input signal 202 experiences a stair step feature or distortion due to a signal reflection in an asymmetric transmission line system. This stair step feature delays the fall of input signal 202 by a time substantially equal to the time between 230 and 232. At time 234 input signal 202 falls below lower threshold 208, and continues falling until time 236 when input signal 202 reaches low level 204.

Waveforms 238 and 240 in FIG. 2 represent signals that can occur at nodes 108 and 116, respectively, in buffer circuit 100 in the embodiment shown in FIG. 1. As illustrated, as input signal 202 begins to rise, and then rises above lower threshold 208, second transistor 104 begins to turn on, and the voltage at node 108 begins to transition from high to low. Note that, at this point, transistor 102 is still on (i.e., in the conductive state) because the voltage of input signal 202, which is applied as input signal 107, has not reached the threshold of transistor 102. This means that transistor 102 and second transistor 104 will both be in the conductive state for a short period of time during the transition of input signal 202, and that the current through first and second transistors 102 and 104 is limited during this period by resistive element 106. Additionally, the presence of resistive element 106 produces a separation between node 108 and node 116. This allows node 108 to be pulled to a low level even when transistor 102 is still on as input signal 202 transitions from low to high.

As input signal 202 rises above higher threshold 218, transistor 102 begins to turn off which causes signal 240 at node 116 transition from high to low.

As signal 238 at node 108 changes from high to low, the signals at the input of inverter 110 and the gate of third transistor 112 also change from high to low. First inverter 110 inverts and delays signal 238 to produce a signal at an output of first inverter 110 that can be applied to the gate of fourth transistor 114. This delay produced by first inverter 110 means that third transistor 112 begins to turn on before fourth transistor 114 begins to turn off, thereby causing a brief period wherein third and fourth transistors 112 and 114 are both turned on (e.g., in the conductive mode), and, as a result, node 124 can be briefly pulled high to a voltage near source voltage $V_{DD}$. Note that the configuration of third and fourth transistors 112 and 114 in series, and being driven by signal 238 and a delayed, inverted signal 238, respectively, produces a momentary high signal at node 124.

When the voltage at node 124 is pulled high, third inverter 126 produces a low voltage at node 130. Low voltage at node 130 turns seventh transistor 132 on, and turns eighth transistor 134 off, which tends to pull node 124 high. Thus, when node 124 is not being momentarily pulled high by third and fourth transistors 112 and 114, or being momentarily pulled low by fifth and sixth transistors 120 and 122, node 124 can be held high, or latched high, until it is pulled low.

In one embodiment, third and fourth transistors 112 and 114, and fifth and sixth transistors 120 and 122, can be much larger transistors, and thus able to conduct more current, than either seventh transistor 132 or eighth transistor 134. Thus, the tendency of seventh transistor 132 to pull node 124 high may be overcome by momentarily conducting current through both fifth and sixth transistors 120 and 122. Similarly, the tendency of eighth transistor 134 to pull node 124 low may be overcome by momentarily conducting current through both third and fourth transistors 112 and 114. The higher current carrying capacity of transistors 112, 114, 120, and 122 can be implemented by making these transistors larger (i.e., having a much greater width/length ratio) than seventh and eighth transistors 132 and 134.

A low level at node 130 can be inverted by fourth inverter 128 to produce a high level in output signal 242 at output 136. In the embodiment shown in FIG. 1, buffer circuit 100 is a noninverting buffer. In another embodiment, buffer circuit 100 can be an inverting buffer, which can be implemented by adding an additional inverter at the output of inverter 128, or by outputting the voltage at node 130.

Note that output signal 242 changes from a low signal (e.g., outputting a first logic value) to a high signal (e.g., outputting a second logic value) in response to input signal 202 rising above lower threshold 208. An output signal of a known buffer circuit that uses conventional hysteresis (shown as conventional output signal 244, $OUT_{CONV}$) would switch from a low level signal to a high level signal only after input signal 202 rises above higher threshold 218 near time 220. Thus, there can be a difference in time from when input buffer 100 in FIG. 1 switches from low to high, and when an input buffer using conventional hysteresis switches from low to high, wherein the difference is substantially equal to the difference between time 212 and time 220. Part of this time difference is caused by the stair-stepped waveform shown in input signal 202 between times 214 and 216. And part of the time difference is due to the difference between switching in response to the input signal rising above the lower threshold, and the conventional switching in response to the input signal rising above the higher threshold.

At time 228, as input signal 202 falls below higher threshold 218, transistor 102 begins to turn on, and in response signal 240 at node 116 begins to transition from low to high. At this moment, first and second transistors 102 and 104 are both on, for a short period of time, and the current through first and second transistors 102 and 104 can be limited by resistive element 106. As mentioned above, the presence of resistive element 106 produces a separation between node 108 and node 116. This allows node 116 to be pulled high even while second transistor 104 is still on as input signal 202 transitions from high to low.

As signal 240 at node 116 changes from low to high, the signals that the input of inverter 118 and the gate of fifth transistor 120 also change from low to high. Second inverter 118 inverts and delays signal 240 to produce a signal at an output of second inverter 118 that can be applied to the gate of sixth transistor 122. This delay produced by second inverter 118 means that fifth transistor 120 begins to turn on before sixth transistor 122 begins to turn off, thereby causing a brief period wherein fifth and sixth transistors 120 and 122 are both turned on (e.g., in the conductive of mode) and node 124 can be briefly pulled low to a voltage near voltage source $V_{SS}$. Note that the configuration of fifth and sixth transistors 120 and 122 in series, and being driven by signal 240 and a delayed, inverted signal 240, respectively, produces a momentary low signal at node 124.

When the voltage at node 124 is pulled low, third inverter 126 produces a high voltage at node 130. High voltage at node 130 turns eighth transistor 134 on, which tends to pull node 124 low. Thus, when node 124 is not being momentarily pulled low by fifth and sixth transistors 120 and 122, node 124 can be held low, or latched low, until it is pulled high. Node 124 can be pulled high by third and fourth transistors 112 and 114 because third and fourth transistors 112 and 114 are larger than eighth transistor 134, and third and fourth transistors 112 and 114 can supply current that can overcome the current drive capacity of eighth transistor 134.

A high voltage at node 130 can be inverted by fourth inverter 128 to produce a low voltage in output signal 242 at output 136.

Note that output signal 242 changes from a high signal (e.g., outputting a second logic value) to a low signal (e.g., outputting a first logic value) in response to input signal 202 falling below higher threshold 218. In a known buffer circuit, conventional output signal 244, which changes according to conventional hysteresis, switches from a high level signal to a low level signal only after input signal 202 falls below lower threshold 208 at time 234. Thus, the output of input buffer 100 in FIG. 1 switches from high to low near time 228, while a conventional buffer circuit using conventional hysteresis switches from high to low at time 234, a difference in time that is partially caused by the stair-stepped waveform shown between times 230 and 232, and partially due to the difference between switching in response to a signal falling through higher threshold 218 rather than a signal falling through lower threshold 208.

Figure 3:
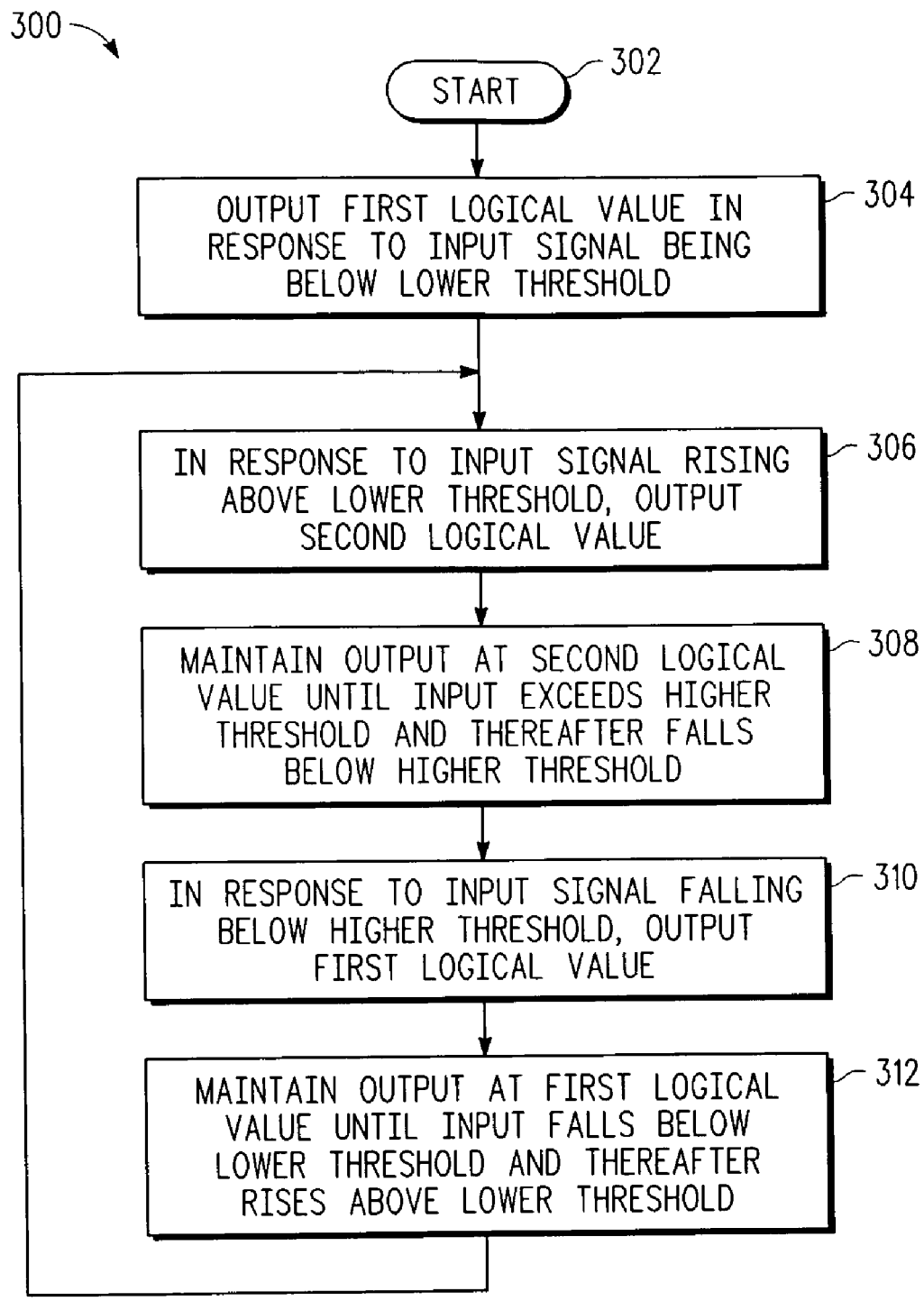
FIG. 3 is a flowchart of one or more processes that can be implemented in a buffer circuit in accordance with one or more embodiments.

Referring now to FIG. 3, there is depicted a high-level flowchart 300 of one or more processes that can be executed by input buffer circuit 100, or another similar buffer system with appropriate functionality, in accordance with the one or more embodiments. As shown, flowchart 300 begins at 302, and thereafter passes to 304, wherein the process outputs a first logic value in response to the input signal being below a lower threshold. In flowchart 300, step 304 can represent outputting a logic value of an initial condition of the buffer circuit, wherein input signal 202 happens to be below lower threshold 208 (see FIG. 2). In other embodiments, the initial condition can have an input signal at various other levels, such as an input above the higher threshold, which can produce an output of a second logic value.

In the embodiment shown in FIG. 1, output 136 can be held low when eighth transistor 134 is on, thereby latching or maintaining node 124 at a low level. When node 124 is low, third inverter 126 outputs a high level at node 130, and fourth inverter 128 outputs a low level at output 136.

In one embodiment, an output of a first logic value can be a low value, which can be, for example, a low voltage or a low current output, depending upon a mode of operation (e.g., a voltage mode or a current mode). Similarly, an output of a second logic value can be a high value (e.g., a high voltage or a high current). In an embodiment where buffer circuit 100 is a non-inverting buffer, buffer circuit 100 can output the first logic value in response to receiving a low input signal, and can output the second logic value in response to receiving a high input signal. Conversely, in an embodiment where buffer circuit 100 is an inverting buffer, buffer circuit 100 can output the second logic value in response to receiving a low input signal, and can output the first logic value in response to receiving a high input signal.

The lower threshold, in one embodiment, can be implemented as a level substantially equal to 25% (shown at 208 in FIG. 2) of a full range of signal values of the buffer circuit (shown at range 210). For example, if the buffer operates using a power supply having 3 Volts (V), lower threshold 208 can be set at 0.75 V, which is 25% of 3 V. In other embodiments, other thresholds can be used. There are advantages, however, to setting lower threshold 208 at a level below the level of the stair step feature, which is shown at time 214 in FIG. 2. In some embodiments, lower threshold 208 can be set to a threshold voltage, or turn on voltage, of second transistor 104.

After initially outputting the first logic value, the process can switch to output the second logic value in response to the input signal rising above the lower threshold, as illustrated at 306. Thus, at 306, the buffer circuit detects a rising signal that passes through the lower threshold. In the embodiment shown in FIG. 1, input signal 202 rising above lower threshold 208 produces a falling signal 238 at node 108. Falling signal 238 momentarily produces a high signal at node 124, which produces a high at output 136 near time 212 in FIG. 2.

After outputting the second logic value, the process maintains the output at the second logic value until the input signal exceeds a higher threshold and thereafter falls below the higher threshold, as depicted at 308. The higher threshold is higher than the lower threshold, and the higher threshold can have a value equal to 75% of the full range of output values of buffer circuit 100 (i.e., a value close to the level of a supply source, such as voltage supply $V_{DD}$). For example, if the buffer operates using a power supply having 3 V, a high threshold can be set at 2.25 V, which is 75% of 3 V. In some embodiments, higher threshold 218 can be set to a threshold voltage, or turn on voltage, of first transistor 102.

In the embodiments shown and described with reference to FIGS. 1 and 2, higher threshold 218 is set above a stair step feature (shown at times 214 and 216) in input signal 202. In many embodiments, the stair step feature will occur at a level substantially equal to 50% of full logic level range 210, especially when the impedance of the transmitter that originated input signal 202 to all buffer circuits receiving input signal 202 is matched to the impedance of the transmission lines of the data interconnect system.

As part of maintaining the output at the second logic value, the buffer circuit can be said to latch the output level at the second logic value until the input signal has both exceeded the higher threshold and then falls below the higher threshold. In FIG. 1, output 136 can be held at the second logic value by turning seventh transistor 132 on using the output of third inverter 126.

Next, in response to the input signal falling below the higher threshold, the process outputs the first logic value, as illustrated at 310. In input buffer 100 in FIG. 1, when input signal 202 falls below higher threshold 218, signal 240 at node 116 begins to rise, which causes node 124 to be momentarily pulled to the first logic value.

After outputting the first logic value, the process maintains the output at the first logic value until the input falls below the lower threshold and thereafter rises above the lower threshold, as depicted at 312. In FIG. 1, output 136 can be maintained at first logic value by eighth transistor 134, which holds node 124 low.

Following 312, the process iteratively returns to 306, wherein the process waits for the input signal to rise above the lower threshold.

As shown, the process depicted in flowchart 300 can be iteratively repeated, indefinitely, as buffer circuit 100 receives and interprets input signal levels.

Although the invention is described herein with reference to specific embodiments, various modifications and changes can be made without departing from the scope of the present invention as set forth in the claims below. For example, while the techniques and apparatus for buffering an input signal may vary widely, one or more embodiments can be used in a high-speed memory interface, or a high-speed switched communication system, or the like. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or an essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An input buffer comprising:
   a threshold detector having an input for receiving an input signal, and having a threshold detector output for outputting a threshold crossing signal, wherein the threshold crossing signal is responsive to the input signal rising above a lower threshold, and responsive to the input signal falling below a higher threshold, wherein the lower threshold is less than the higher threshold;
   a first pulse generator having an input coupled to the threshold detector output, and having a first pulse generator output for outputting a first pulse having a pulse duration related to a signal propagation time through an inverter and having a second logic value in response to the threshold crossing signal rising above the lower threshold;
   a second pulse generator having an input coupled to the threshold detector output, and having a second pulse generator output for outputting a second pulse having a first logic value in response to the threshold crossing signal falling below the higher threshold; and
   a latch coupled to the first pulse generator output, and coupled to the second pulse generator output, and having a buffer output for outputting a buffered signal responsive to the first pulse and the second pulse.

2. The input buffer according to claim 1 wherein the threshold detector comprises a threshold detector for producing the threshold crossing signal, wherein the threshold crossing signal has a logic value transition in response to the input signal rising above the lower threshold, and in response to the input signal falling below the higher threshold.

3. The input buffer according to claim 1 wherein the threshold detector comprises a threshold detector for producing, in response to the input signal, a lower threshold crossing signal, and a higher threshold crossing signal, wherein the lower threshold crossing signal has a logic value transition in response to the input signal rising above the lower threshold, and wherein the higher threshold crossing signal has a logic value transition in response to the input signal falling below the higher threshold.

4. The input buffer according to claim 3 wherein the threshold detector comprises a threshold detector for producing a falling logic value transition in response to a rising input signal that rises above the lower threshold, and for producing a rising logic value transition in response to a falling input signal that falls below the higher threshold.

5. The input buffer according to claim 1 wherein the first pulse generator comprises:
   a third transistor of a first conductivity type having a first current electrode, a second current electrode coupled to the first pulse generator output, and a control electrode coupled to the threshold detector output;
   a first inverter having an input coupled to the threshold detector output, and an output; and
   a fourth transistor of the first conductivity type having a first current electrode coupled to a first voltage source, a second current electrode coupled to the first current electrode of the third transistor, and a control electrode coupled to the output of the first inverter.

6. The input buffer according to claim 1 wherein the second pulse generator comprises:
   a fifth transistor of a first conductivity type having a first current electrode, a second current electrode coupled to the second pulse generator output, and a control electrode coupled to the threshold detector output;
   a second inverter having an input coupled to the threshold detector output, and an output; and
   a sixth transistor of the first conductivity type having a first current electrode coupled to a second voltage source, a second current electrode coupled to the first current electrode of the fifth transistor, and a control electrode coupled to the output of the second inverter.

7. The input buffer according to claim 1 wherein the latch comprises:
   a third inverter having an input coupled to the first pulse generator output, and coupled to the second pulse generator output, and having an output coupled to the buffer output;
   a seventh transistor of a first conductivity type having a first current electrode coupled to a first voltage source, a second current electrode coupled to the input of the third inverter, and a control electrode coupled to the output of the third inverter; and
   an eighth transistor of a second conductivity type having a first current electrode coupled to a second voltage source, a second current electrode coupled to the input of the third inverter, and a control electrode coupled to the output of the third inverter.

8. The input signal buffer according to claim 7 wherein the latch further comprises a fourth inverter having an input coupled to the output of the third inverter, and having an output for outputting a non-inverted buffered signal.

9. An input signal buffer comprising:
   a first transistor of a first conductivity type having a first current electrode coupled to a first voltage source, a second current electrode, and a control electrode coupled to an input;
   a resistive element having a second terminal, and a first terminal coupled to the second current electrode of the first transistor;
   a second transistor of a second conductivity type having a first current electrode coupled to a second voltage source, a second current electrode coupled to the second terminal of the resistive element, and a control electrode coupled to the input;
   a third transistor of the first conductivity type having a first current electrode, a second current electrode, and a control electrode coupled to the second current electrode of the second transistor;
   a first inverter having an input coupled to the second current electrode of the second transistor, and an output;
   a fourth transistor of the first conductivity type having a first current electrode coupled to the first voltage source, a second current electrode coupled to the first current electrode of the third transistor, and a control electrode coupled to the output of the first inverter,
   a fifth transistor of the second conductivity type having a first current electrode, a second current electrode coupled to the second current electrode of the third transistor, and a control electrode coupled to the second current electrode of the first transistor;
   a second inverter having an input coupled to the second current electrode of the first transistor, and an output;
   a sixth transistor of the second conductivity type having a first current electrode coupled to the second voltage source, a second current electrode coupled to the first current electrode of the fifth transistor, and a control electrode coupled to the output of the second inverter;

a third inverter having an input coupled to the second current electrode of the third transistor, and an output for outputting an inverted buffered signal;

a seventh transistor of the first conductivity type having a first current electrode coupled to the first voltage source, a second current electrode coupled to the second current electrode of the third transistor, and a control electrode coupled to the output of the third inverter; and an eighth transistor of the second conductivity type having a first current electrode coupled to the second voltage source, a second current electrode coupled to the second current electrode of the third transistor, and a control electrode coupled to the output of the third inverter.

10. The input signal buffer according to claim 9 further comprising a fourth inverter having an input coupled to the output of the third inverter, and an output for outputting a non-inverted buffered signal.

11. The input signal buffer according to claim 9 wherein the resistive element is a polysilicon resistive element.

12. The input signal buffer according to claim 9 wherein the first transistor of a first conductivity type is a first P-channel transistor.

13. The input signal buffer according to claim 9 wherein the second transistor of a second conductivity type is a second N-channel transistor.

* * * * *